United States Patent
Kang et al.

(10) Patent No.: US 7,337,453 B2
(45) Date of Patent: Feb. 26, 2008

(54) ACTUATOR EMPLOYING A BOBBIN INCORPORATING A WINDING COIL AND A MANUFACTURING METHOD THEREOF

(75) Inventors: Myung-Sam Kang, Daejeon (KR);
Kyung-Sik Shin, Kyunggi-Do (KR);
Won-Cheol Bae, Kyunggi-Do (KR);
Chang-Sup Ryu, Daejeon (KR)

(73) Assignee: Samsung Electro-Mechanics Co., Ltd., Kyunggi-do (KR)

( * ) Notice: Subject to any disclaimer, the term of this patent is extended or adjusted under 35 U.S.C. 154(b) by 154 days.

(21) Appl. No.: 10/704,811

(22) Filed: Nov. 12, 2003

(65) Prior Publication Data
US 2005/0060732 A1    Mar. 17, 2005

(30) Foreign Application Priority Data
Sep. 16, 2003   (KR) .................... 10-2003-0064123

(51) Int. Cl.
*G11B 7/085*   (2006.01)
*G11B 7/09*    (2006.01)

(52) U.S. Cl. .................... 720/685; 720/683; 369/44.14

(58) Field of Classification Search ............ 369/44.11, 369/44.14, 44.22, 244.1, 247.1, 135, 243, 369/811–827; 720/681, 682, 683, 684, 685, 720/662
See application file for complete search history.

(56) References Cited

U.S. PATENT DOCUMENTS 5,555,228 A * 9/1996 Izuka ..................... 369/44.15
6,462,892 B1 * 10/2002 Kuroki ..................... 359/813
6,504,813 B2 * 1/2003 Suzuki et al. ............. 720/683
6,570,720 B2 * 5/2003 Kawano ..................... 359/813
6,741,543 B1 * 5/2004 Suzuki et al. ............. 720/683
2002/0005995 A1 * 1/2002 Choi et al. ................ 359/819
2003/0198148 A1 * 10/2003 Choi ........................ 369/44.16
2006/0077785 A1 * 4/2006 Kuo ........................ 369/44.14

FOREIGN PATENT DOCUMENTS

| JP | 61-026945 | 2/1986 |
|----|-----------|--------|
| JP | 63-129535 | 6/1988 |
| JP | 11-185268 | 7/1999 |
| JP | 11-306563 | 11/1999 |
| JP | 2000-011412 | 1/2000 |

* cited by examiner

*Primary Examiner*—Brian E. Miller
*Assistant Examiner*—Matthew G. Kayrish
(74) *Attorney, Agent, or Firm*—Morgan, Lewis & Bockius LLP

(57) ABSTRACT

An optical pickup actuator and a method thereof includes a bobbin having a lens to scan a laser beam on a track of a disc, a winding coil moving the bobbin on the track in focusing and tracking directions, and an integrated circuit board used as the bobbin using a printed circuit board manufacturing technology and integrally formed with the winding coil in a monolithic body. The bobbin used with the optical pickup actuator includes the printed circuit board, a plurality of tracking circuit patterns formed on both surfaces of the PCB, a plurality of focusing circuit patterns formed on the both surfaces of the PCB, a plurality of via holes formed on the PCB to electrically connect the tracking circuit patterns and the focusing circuit patterns, an objective lens mounting unit formed on the PCB, and a connecting pad through which a power is supplied to the tracking and focusing circuit patterns.

27 Claims, 13 Drawing Sheets

ACTUATOR EMPLOYING A BOBBIN INCORPORATING A WINDING COIL AND A MANUFACTURING METHOD THEREOF

CROSS-REFERENCE TO RELATED APPLICATION

This application claims to benefit of Korean Patent Application No. 2003-64123, filed Sep. 16, 2003, in the Korean Intellectual Property Office, the disclosure of which is incorporated herein by reference.

BACKGROUND OF THE INVENTION

1. Field of the Invention

The present invention relates to a bobbin integrally formed with a winding coil, an actuator employing the bobbin, and a manufacturing method thereof, and more particularly, to a bobbin integrally formed with a winding coil using a printed circuit board technology to move the bobbin in a precise position in tracking and focusing directions, an actuator employing the bobbin, and a manufacturing method thereof.

2. Description of the Related Art

FIG. 1 is a conventional optical pickup device. As shown in FIG. 1, a general optical pickup device 10 is assembled with a main axle 3 and an auxiliary axle 5 provided on a deck panel 1 of an optical driver to reciprocate in an axis of the main axle 3 to reproduce a signal recorded on an optical disc D or record a signal on the optical disc D. The optical pickup device 10 includes a base 30 reciprocating along the axis together with the main axle 3 and the auxiliary axle 5, and an actuator disposed on the base 30 to move together with the base 30 so that an input optical beam is converged into a spot of the optical disc D.

FIG. 2 is a perspective view of an actuator 20 of the optical pickup device shown in FIG. 1. As shown in FIG. 2, the actuator 20 includes a bobbin 22 having an objective lens and focusing and tracking coils 23 and 24 of a copper wire to minutely and precisely move the objective lens in a focusing direction, e.g., an upward or downward direction, as well as a tracking direction, e.g., a left or right direction. A magnetic unit 27 and a yoke 28 are disposed around the bobbin to generate an electromagnetic field.

The bobbin 22 is elastically supported to a holder 26 through a wire 25 horizontally extended in the tracking direction. That is, one end of the wire 25 is coupled to the bobbin 22 by soldering, and the other end of the wire 25 is fixed to the holder 26. Therefore, the bobbin can minutely move in the upward, downward, left, and right directions using an elastic force of the wire 25.

The actuator 20 moves the objective lens 21 in the focusing and tracking directions according to an electromagnetic force generating when power is supplied to the respective focus and tracking coils 23 and 24 through the wire 25.

A conventional actuator module having the winding coil uses a conventional technology, such as a Lorentz force, to move the bobbin, and a principle, e.g., the Lorentz force, can be used in the winding coil. When current flows through the winding coil made of the copper wire, the Lorentz force is generated according to an influence of the magnetic field of a permanent magnetic unit disposed in front of the winding coil so that the bobbin is moved in the upward, downward, left, and right directions. A plurality of winding coils are disposed adjacent to the permanent magnet unit to control and adjust upward, downward, left, and right movements of the bobbin.

As industry is highly developed, electronic products are minimized in size, and an actuator used with a thinner and smaller product is produced according to user demands. In the conventional actuator module, since the winding coil is wound to be disposed adjacent to the bobbin, and the winding coil is required to have a predetermined size to obtain a necessary sensitivity, it is impossible to minimize the electronic product in size. Moreover, when a number of parts are assembled, it is disadvantages in that a manufacturing process becomes complicated, and that a defect ratio of the electronic product increases.

Furthermore, it is an advantage in that in the conventional winding coil, the copper wire of the winding coil can be easily cut off. When the permanent magnet unit includes a number of complicated divided magnets according to the arrangement of the coils so as to reduce a volume of the bobbin, the manufacturing costs of the permanent magnet unit increase, and a very difficult technology is required to produce the bobbin.

SUMMARY OF THE INVENTION

In order to solve the above and/or other problems, it is an aspect of the present invention to provide a bobbin integrally formed with a winding coil using an improved printed circuit board technology to reduce the number of parts and a weight of an actuator used with a disc recording and/or reading apparatus.

It is another aspect of the present invention to provide an improved bobbin having a better sensitivity in upward, downward, left, and right movements using an improved printed circuit board technology compared to a winding coil type actuator since the improved bobbin is small in weight.

It is another aspect of the present invention to provide a bobbin integrated with a winding coil to reduce manufacturing process and cost by producing an actuator module with an attachment process of attaching a lens and a wire to the bobbin integrated with the winding coil.

It is another aspect of the present invention to provide an optical pickup actuator used with an electronic product, of which thickness becomes reduced according to demands on a thin and minimized product, by forming a bobbin and a winding coil integrally on a printed circuit board to be used in a horizontal direction so as to overcome a difficulty in reducing the thickness of the bobbin due to a thickness of the winding coil.

It is another aspect of the present invention to provide a bobbin integrally formed with a winding coil, in which a focus driving coil is a spiral type, and a tacking driving coil is a solenoid type, and which can be used with a magnet, which dose not need divide polarities, regardless of a location of the bobbin with respect to the magnet.

Additional aspects and advantages of the invention will be set forth in part in the description which follows and, in part, will be obvious from the description, or may be learned by practice of the invention.

To achieve the above and/or other aspects, there is provided an integrated circuit board formed with circuit patterns and via holes to replace conventional winding coils moving a bobbin in upward, downward, left, and right directions. The bobbin moves according to the Lorentz force generated by a magnetic field on the circuit patterns and the via holes. The circuit patterns includes focusing circuit patterns formed in a spiral type coil shape to move the bobbin in the focusing direction, and the tracking circuit pattern formed in a solenoid type coil shape to move the bobbin in the tracking direction.

To achieve the above and/or other aspects, there is provided a bobbin used with an optical pickup actuator including a printed circuit board (PCB), a plurality of tracking circuit patterns former on both surfaces of the PCB, a plurality of focusing circuit patterns formed on the both surfaces of the PCB, a plurality of via holes formed on the PCB to electrically connect the tracking circuit patterns and the focusing circuit patterns, an objective lens mounting unit formed on the PCB, and a connecting pad through which a power is supplied to the tracking and focusing circuit patterns.

To achieve the above and/or other aspects, there is provided an optical pickup actuator including a bobbin having a printed circuit board (PCB), a plurality of tracking circuit patterns formed on both surfaces of the PCB, a plurality of focusing circuit patterns formed on the both surfaces of the PCB, a plurality of via holes formed on the PCB to electrically connect the tracking circuit patterns and the focusing circuit patterns, an objective lens mounting unit formed on the PCB, and a connecting pad through which a power is supplied to the tracking and focusing circuit patterns, a wire connected to the connecting pad, and through which the power is supplied to the tracking and focusing circuit patterns, a holder supporting the wire, and a magnetic body generating a magnetic field exerting an force on the tracking circuit pattern in a tracking direction and on the focusing circuit patterns in a focusing direction.

To achieve the above and/or other aspects, there is provided a method of forming a bobbin used with an optical pickup actuator, the method including forming an objective lens mounting unit on a PCB, and forming a plurality of via holes on a PCB to electrically connect a plurality of tracking circuit patterns and a plurality of focusing circuit patterns, electrolysis-coating a conductive material line on inside surface of the via holes, forming an etching resist pattern on both surfaces of the PCB corresponding to the tracking circuit patterns and the focusing circuit patterns, etching the PCB using the etching resist pattern, forming solder resist patterns on the both surface of the PCB, and cutting off the PCB by a size corresponding to the bobbin.

To achieve the above and/or other aspects, there is provided a disc player having an optical pickup actuator, the disc player including a bobbin made of a printed circuit board (PCB) and movably mounted on the actuator, a plurality of tracking circuit patterns formed on both surfaces of the PCB, a plurality of focusing circuit patterns formed on the both surfaces of the PCB, a plurality of via holes formed on the PCB and having a conductive material line to electrically connect the tracking circuit patterns and the focusing circuit patterns, an objective lens mounting unit formed on the PCB, and a connecting pad through which a power is supplied to the tracking and focusing circuit patterns.

To achieve the above and/or other aspects, there is provided a bobbin used with an optical pickup actuator of a disc player having a holder and a power source, the bobbin including a printed circuit board (PCB) having major surfaces, a pair of tracking circuit patterns formed on corresponding ones of the major surfaces of the PCB, a first conductive material line disposed along the thickness of the PCB and having a conductive material line to electrically connect the tracking circuit patterns, a pair of focusing circuit patterns formed on corresponding ones of the major surfaces of the PCB, and a second conductive material line disposed along the thickness of the PCB to electrically connect the focusing circuit patterns.

To achieve the above and/or other aspects, there is provided a disc player having an optical pickup actuator having a holder and a power source, the disc player including a printed circuit board (PCB) having major surfaces, a pair of tracking circuit patterns formed on corresponding ones of the major surfaces of the PCB, a first conductive material line disposed along the thickness of the PCB to electrically connect the tracking circuit patterns, a pair of focusing circuit patterns formed on corresponding ones of the major surfaces of the PCB, a second conductive material line disposed along the thickness of the PCB to electrically connect the focusing circuit patterns, a wire unit elastically supporting the PCB with respect to the holder, and electrically connecting the power source to the tracking circuit patterns and the focusing circuit pattern through the first and second conductive material lines, and a magnetic body disposed along a side of the PCB to generate a magnetic field to generate a tracking force according to a direction of a first current flowing through the tracking circuit patterns and the first conductive material line and a focusing force according to a direction of a second current flowing through the focusing circuit patterns.

To achieve the above and/or other aspects, there is provided a bobbin used with an optical pickup actuator of a disc player having a holder and a power source, ≱bobbin including a printed circuit board (PCB) having major surfaces and first and second via holes formed along the thickness of the PCB, a pair of tracking circuit patterns formed on corresponding ones of the major surfaces of the PCB, a first conductive material line disposed in the first via hole to electrically connect the tracking circuit patterns, a pair of focusing circuit patterns formed on corresponding ones of the major surfaces of the PCB, and a second conductive material line disposed in the second via hole to electrically connect the focusing circuit patterns.

To achieve the above and/or other aspects, there is provided a disc player having an optical pickup actuator having a holder and a power source, the disc player including a printed circuit board (PCB) having major surfaces and first and second via holes formed along the thickness of the PCB, a pair of tracking circuit patterns formed on corresponding ones of the major surfaces of the PCB, a first conductive material line disposed in the first via hole to electrically connect the tracking circuit patterns, a pair of focusing circuit patterns formed on corresponding ones of the major surfaces of the PCB, a second conductive material line disposed in the second via hole to electrically connect the focusing circuit patterns, a wire unit elastically supporting the PCB with respect to the holder, and electrically connecting the power source to the tracking circuit patterns and the focusing circuit pattern through the first and second conductive material lines, and a magnetic body disposed along a side of the PCB to generate a magnetic field to generate a tracking force according to a direction of a first current flowing through the tracking circuit patterns and the first conductive material line and a focusing force according to a direction of a second current flowing through the focusing circuit patterns.

To achieve the above and/or other aspects, there is provided a bobbin used with an optical pickup actuator of a disc player having a holder and a power source, the bobbin including a printed circuit board (PCB) having major surfaces and a via hole formed along the thickness of the PCB, a pair of tracking circuit patterns formed on corresponding ones of the major surfaces of the PCB, and a conductive material line disposed in the via hole to electrically connect the tracking circuit patterns.

To achieve the above and/or other aspects, there is provided a disc player having an optical pickup actuator having a holder and a power source, the disc player including a printed circuit board (PCB) having major surfaces and a via hole formed along the thickness of the PCB, a support elastically supporting the PCB with respect to the holder, a pair of tracking circuit patterns formed on corresponding ones of the major surfaces of the PCB and electrically connected to the power source, a conductive material line disposed in the via hole to electrically connect the tracking circuit patterns, and a magnetic body generating a magnetic filed so that a magnetic force is exerted on the PCB according to a current direction of the conductive material line.

To achieve the above and/or other aspects, there is provided a bobbin used with an optical pickup actuator of a disc player having a holder and a power source, the bobbin including a printed circuit board (PCB) having major surfaces and elastically supportable on the holder, a pair of tracking circuit patterns formed on corresponding ones of the major surfaces of the PCB in a direction and electrically connectable to the power source, and a conductive material line disposed along the thickness of the PCB to electrically connect the tracking circuit patterns.

According to another aspect of the present invention, the tracking circuit patterns and the conductive material line form a plane perpendicular to the first direction and the major surfaces.

According to another aspect of the present invention, the bobbin further includes a focusing circuit pattern formed on at least one of the major surfaces of the PCB, disposed parallel to the at least one of the major surfaces, connectable to the power source, and having at least one sub-pattern disposed perpendicular to the conductive material line and the first direction.

To achieve the above and/or other aspects, there is provided a disc player having an optical pickup actuator having a holder and a power source, the disc player including a printed circuit board (PCB) having major surfaces and elastically supportable on the holder, a pair of tracking circuit patterns formed on corresponding ones of the major surfaces of the PCB in a direction and electrically connectable to the power source, a conductive material line disposed along the thickness of the PCB to electrically connect the tracking circuit, and a magnetic body generating a magnetic field so that a magnetic force is exerted on the PCB in a tracking direction according to a current direction of the conductive material line.

According to another aspect of the present invention, tracking circuit patterns and the conductive material line form a plane perpendicular to the first direction and the major surfaces.

According to another aspect of the present invention, the disc player further includes a focusing circuit pattern formed on at least one of the major surfaces of the PCB, disposed parallel to the at least one of the major surfaces, connectable to the power source, and having at least one sub-pattern disposed perpendicular to the conductive material line and the first direction.

BRIEF DESCRIPTION OF THE DRAWINGS

These and/or other advantages of the invention will become apparent and more readily appreciated from the following description of the preferred embodiments, taken in conjunction with the accompanying drawings of which.

DETAILED DESCRIPTION OF THE PREFERRED EMBODIMENTS

Figure 1:
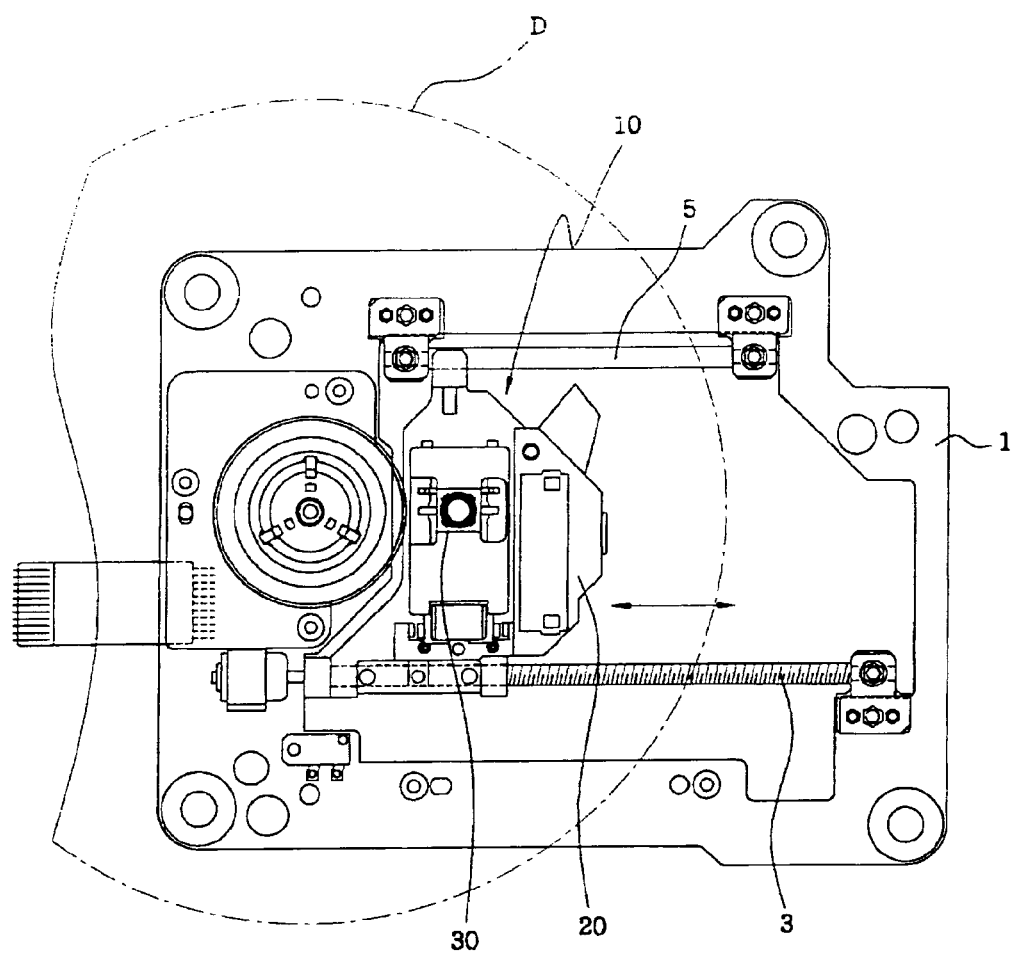
FIG. 1 is a conventional optical pickup device.

Reference will now be made in detail to the present preferred embodiments of the present invention, examples of which are illustrated in the accompanying drawings, wherein like reference numerals refer to the like elements throughout. The embodiments are described below in order to explain the present invention by reference to the figures.

Figure 3:
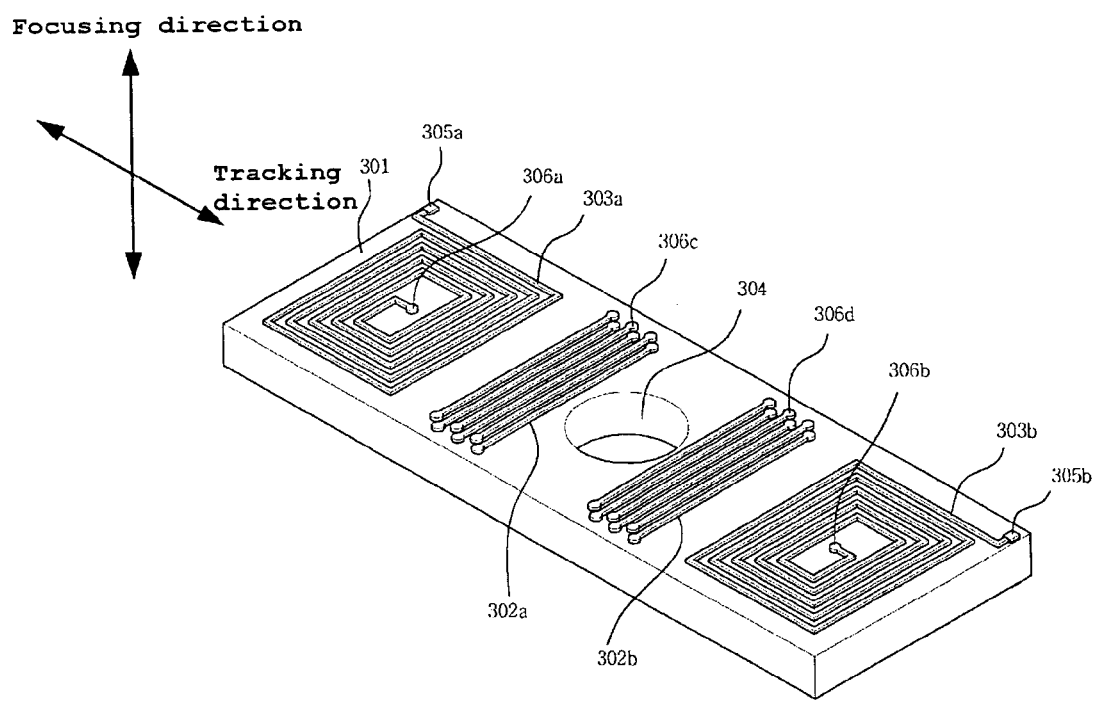
FIG. 3 is s perspective view of a bobbin integrally formed with a winding coil on a printed circuit board used with an optical pickup device of a disc recording and/or reading apparatus according to an embodiment of the present invention.

FIG. 3 is s perspective view of a bobbin integrally formed with a winding coil on a printed circuit board used with an optical pickup device of a disc recording and/or reading apparatus (disc player) according to an embodiment of the present invention.

An objective lens attachment portion 304 is formed on a center portion of a printed circuit board (PCB) 301, and an objective lens is attached to the objective lens attachment portion 304. First and second tracking circuit patterns 302a and 302b are formed to be symmetrically disposed on both sides of the objective lens attachment portion 304, respectively. First and second focusing circuit patterns 303a and 303b are formed to be symmetrically disposed on respectively outsides of the first and second tracking circuit patterns 302a and 302b.

The first and second tracking circuit patterns 302a and 302b are a coil structure wound around an axis in a tracking direction, and the first and second focusing circuit patterns 303a and 303b are a coil structure wound around in a focusing direction. That is, the first and second tracking circuit patterns 302a and 302b are a solenoid type coil structure having the axis in the tracking direction, and the first and second focusing circuit patterns 303a and 303b are a spiral type coil structure having the axis in the focusing direction.

The first and second tracking circuit patterns 302a and 302b are formed on a rear side of the PCB 301 as well as a front side of the PCB 301 in pair, and the first and second focusing circuit patterns 303a and 303b are formed on the rear side of the PCB 301 as well as the front side of the PCB 301 in pair A plurality of tracking via holes 306c and 306d are formed on both ends of the first and second tracking circuit patterns 302a and 302b to electrically connect the first and second tracking circuit patterns 302a and 302b which are disposed on the front and rear sides of the PCB 301. A plurality of focusing via holes 306a and 306b are formed on center ends of the first and second focusing circuit patterns 303a and 303b to electrically connect the first and second focusing circuit patterns 303a and 303b which are disposed on the front and rear sides of the PCB 301. Connection pads 305a and 305b are formed on ends of the first and second focusing circuit patterns 303a and 303b to connect current supplies as will be further described with reference to FIGS. 4 and 5.

A magnetic field is generated around a magnet. When a straight line wire, through which current flows, is disposed in the magnetic field, the wire receives the Lorentz force according to the Fleming right hand rule as follows.

$$F = B\,I\,L \sin\theta$$

Here, F is the Lorentz force (N), B is a magnetic density (wb/m$^2$ or T), I is the amplitude of current (A), L is a length of the straight line wire (m), and θ is an angle formed between a magnetic field direction and a current direction.

A direction of the force exerted on the wire is perpendicular to planes of the current and the magnetic field, and the direction of the force exerted on the wire is reversed when directions of the current and the magnetic field are reversed.

The actuator operates according to the above principles. However, when two wires having the currents in opposite directions are closely disposed to each other, the Lorentz forces exerted on the two wires are offset to be disappeared, and then the sensitivity of the actuator is reduced. Therefore, the magnet fields having opposite directions are formed when the currents having opposite directions flow through two wires (coils), respectively, so as to prevent the Lorentz forces from being offset to be disappeared.

Figure 4:
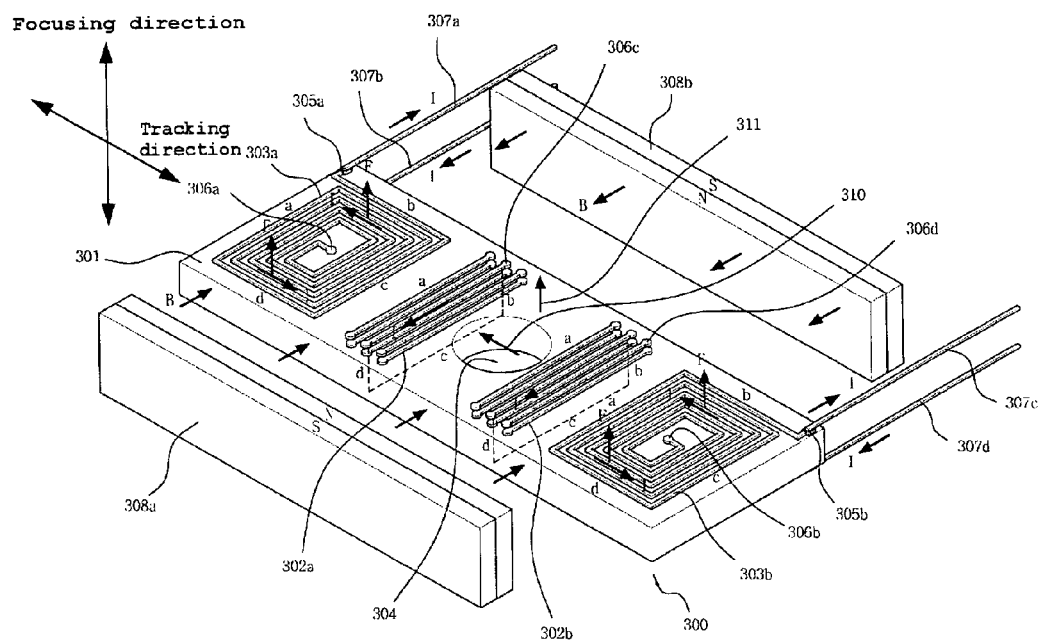
FIG. 4 is a perspective view showing a permanent magnet unit and the bobbin shown in FIG. 3.

FIG. 4 shows a view showing directions of the Lorentz forces generated according to directions of the magnetic field and the current when the currents are supplied to the first and second tracking circuit patterns 302a and 302b and the first and second focusing circuit patterns 303a and 303b through wires 307a, 307b, 307c, and 307d and when permanent magnets 308a and 308b are disposed on both end sides of the bobbin integrated with the winding coil in a single monolithic body.

As shown in FIG. 4, the permanent magnets are arranged adjacent to the bobbin integrally formed with the winding coils to generate the magnetic field to the winding coils, and the wires are connected between a holder (not shown) and corresponding ones of the winding coils to supply a power source to corresponding ones of the winding coils so as to form the actuator. In FIG. 4, F, B, and I represent force, magnetic filed, and current, respectively.

Figure 5A:
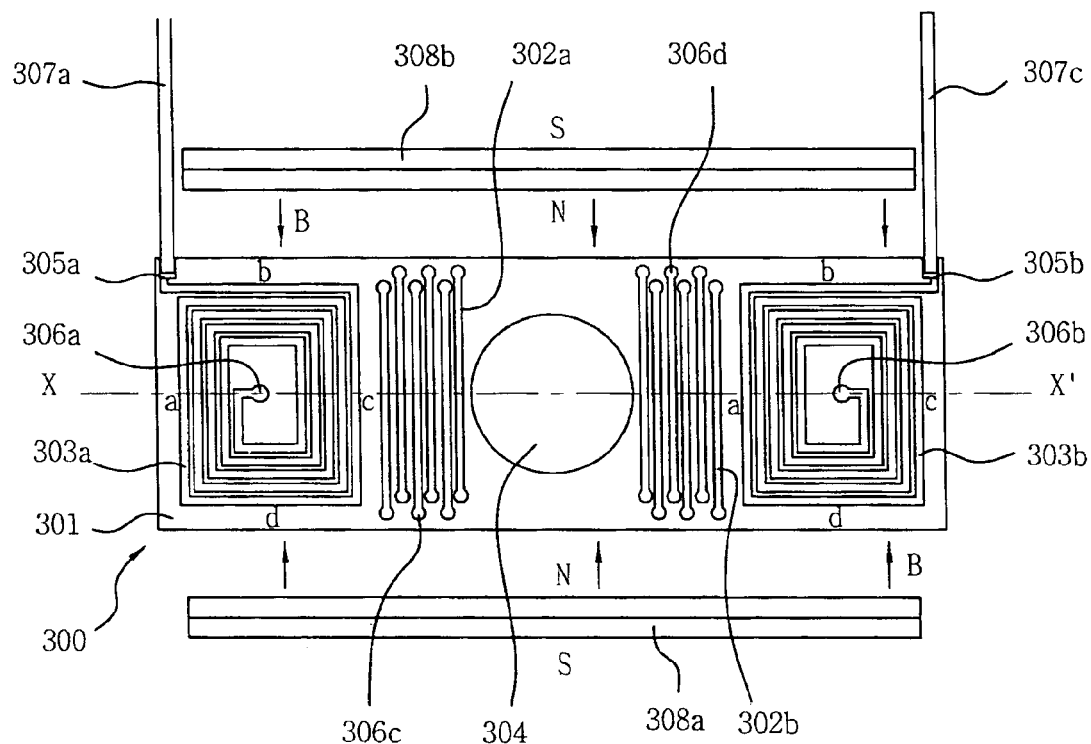
FIG. 5A is a plan view showing the permanent magnet unit and the bobbin shown in FIG. 4.
Figure 5B:
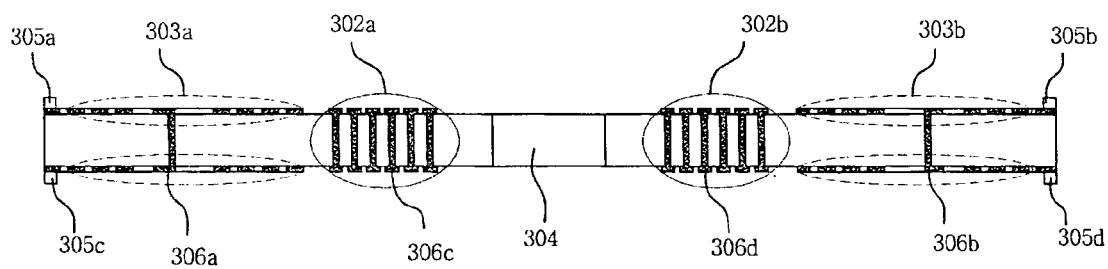
FIG. 5B is a cross-sectional view taken along X-X' of FIG. 5A.

FIG. 5A is a plan view of the bobbin 300 and permanent magnets 308a and 308b, and FIG. 5B is a cross-sectional view taken along a line X-X' of the bobbin of FIG. 5A.

Referring FIGS. 4, 5A, and 5B, the first and second tracking circuit patterns 302a and 302b are formed in the solenoid type, and the first and second focusing circuit patterns 303a and 303b are formed in the spiral type as described above. When the permanent magnets 308a and 308b of a thin plate type are arranged on both sides of the bobbin 300, a magnetic field having a uniform amplitude is generated in a direction toward a center portion between the two permanent magnets 308a and 308b, and the magnetic field is equal to zero at the center portion thereof.

The first tracking circuit patterns 302a and the second tracking circuit patterns 302b disposed on the front and rear sides of the PCB 301 are electrically connected to each other through the via holes 306c and 306d, respectively, and the first focusing circuit patterns 303a and the second focusing circuit patterns 303b disposed on the front and rear sides of the PCB 301 are electrically connected to each other through the via holes 306a and 306b, respectively.

The first and second tracking circuit patterns 302a and 302b are indicated by broken lines a, b, c, and d forming a rectangle, and only the broken line "a" of the first and second tracking circuit patterns 302a and 302b is shown in FIG. 3.

When the currents flow through the wires 307a, 307b, 307c, and 307d in the direction as shown in FIG. 4, the b portion of the first tracking circuit pattern 302a is closer to a permanent magnet 308b than the permanent magnet 308a, and thus the b portion of the first tracking circuit pattern 302a is under the influence of the magnetic field formed by the permanent magnet 308b more than that of the permanent magnet 308a. In consideration of the directions of the currents and the magnetic fields, the force is exerted on the b portion of the bobbin 300 to move in a direction 310.

The d portion of the first tracking circuit pattern 302a is closer to a permanent magnet 308a than the permanent magnet 308b, and thus the b portion of the first tracking circuit pattern 302a is under the influence of the magnetic field formed by the permanent magnet 308a more than the permanent magnet 308b. In consideration of the directions of the currents and the magnetic fields, the force is exerted on the d portion of the first tracking circuit pattern 302a to move the bobbin 300 in the same direction 310 as the b portion of the first tracking circuit pattern 302a.

Since the currents flow through the a and c portions of the first tracking circuit pattern 302a in the opposite parallel directions, the Lorentz forces are not exerted on the a and c portions of the first tracking circuit pattern 302a.

The b and d portions of the second tracking circuit pattern 302b receive the force to push the bobbin 300 in the direction 310. However, the Lorentz forces are not exerted on the a and c portions of the second tracking circuit pattern 302b.

As a result, when the currents flow through the first and second tacking circuit patterns 302a and 302b in the directions shown in FIG. 4, the bobbin 300 receives the force to move in the direction 310 according to the Lorentz force exerted on the first and second tacking circuit patterns 302a and 302b.

The b portion of the first focusing circuit pattern 303a is closer to the permanent magnet 308b than the permanent magnet 308a, and thus the b portion of the first focusing circuit pattern 303a is under the influence of the magnetic field formed by the permanent magnet 308b more than the permanent magnet 308a. In consideration of the directions of the currents and the magnetic fields, the force is exerted on the d portion of the first focusing circuit pattern 303a to lift the bobbin 300 in a direction 311

The d portion of the first focusing circuit pattern 303a is closer to the permanent magnet 308a than the permanent magnet 308b, and thus the d portion of the first focusing circuit pattern 303a is under the influence of the magnetic field formed by the permanent magnet 308a more than by the permanent magnet 308b. In consideration of the directions of the currents and the magnetic fields, the force is exerted on the d portion of the focusing circuit pattern 303a to lift the bobbin 300 in the same direction 311 as the b portion of the first focusing circuit pattern 303a.

Since the currents flow through the a and c portions of the first focusing circuit pattern 303a in the opposite parallel directions, the Lorentz forces are not exerted on the a and b portions of the first focusing circuit pattern 303a.

The b and d portions of the second focusing circuit pattern 303b receive the force to lift the bobbin 300 in the direction 311. However, the Lorentz forces are not exerted on the a and b portions of the second focusing circuit pattern 303b.

As a result, when the currents flow through the first and second focusing circuit patterns 303a and 303b in the directions shown in FIG. 4, the bobbin 300 receives the force to lift in the direction 311 according to the Lorentz force exerted on the first and second tacking circuit patterns 303a and 303b.

In order to move the bobbin 300 in the directions 310 and 311, the current should flows in a downward direction through the d portions of the first and second tracking circuit patterns 302a and 302b and in an upward direction through the b portions of the first and second tracking circuit patterns 302a and 302b.

In addition, the current should flow through the b portion of the first focusing circuit pattern 303a in a directions away from the first tracking circuit pattern 302a, and through the d portion of the first focusing circuit pattern 303a in a direction toward the first tracking circuit pattern 302a. Also, the current should flow through the b portion of the second focusing circuit pattern 303b in a directions toward the second tracking circuit pattern 302b, and through the d portion of the second focusing circuit pattern 303b in a direction away from the second tracking circuit pattern 302b.

Each of the first and second tracking circuit patterns 302a and 302b constitutes a plurality of rectangular type circuits disposed parallel to each other and each having the a, b, c, and d portions. According to another aspect to the invention, the rectangular type circuits are connected to form a solenoid type. For example, the rectangular type circuits formed by the a, b, c, and d portions are connected in a line of the solenoid type. That is, the line winds around an axis parallel to the tracking direction.

Each rectangular type circuit of the first tracking circuit 302a is connected to the wires 307a and 307b, and each rectangular type circuit of the second tracking circuit 302b is connected to the wires 307c and 307d, so that the current flows through each d portion of the first and second tracking circuit patterns 302a and 302b in the downward direction and through each b portion of the first and second tracking circuit patterns 302a and 302b in the upward direction to exert the force on the bobbin 300 to move the bobbin 300 in the direction 310.

The first tracking circuit pattern 302a and the first focusing circuit pattern 303a are electrically connected to each other or directly connected to the wires 307a and 307b shown in FIG. 4, and also the second tracking circuit pattern 302b and the second focusing circuit pattern 303b are electrically connected to each other or directly connected to the wires 307c and 307d shown in FIG. 4.

In FIGS. 4, 5A and 5B, the directions of the currents of the first and second focusing circuit patterns 303a and 303b may be the same, but magnitudes of the respective currents may be different. When the magnitudes of the respective currents are different from each other, the bobbin 300 may be inclined with respect to the focusing direction. Therefore, a disc tilt can be compensated by adjusting the magnitudes of the respective currents.

Since the first and second tracking circuit patterns 302a and 302b shown in FIGS. 4, 5A and 5B do not affect a tilting operation, it is not necessary to supply currents having different magnitudes to the first and second tracking circuit patterns 302a and 302b. Accordingly, it is not necessary to symmetrically form the first and second tracking circuit patterns 302a and 302b, and the first and second tracking circuit patterns 302a and 392b can be connected to each other to form a single coil type.

A structure or shape of the first and second focusing circuit patterns 303a and 303b is formed as a rectangular type coil to be wound about the focusing direction as shown in FIGS. 4, 5A and 5B. However, the present invention is not limited thereto. The structure or shape of the first and second focusing circuit patterns 303a and 303b can be a circular type coil.

Figure 2:
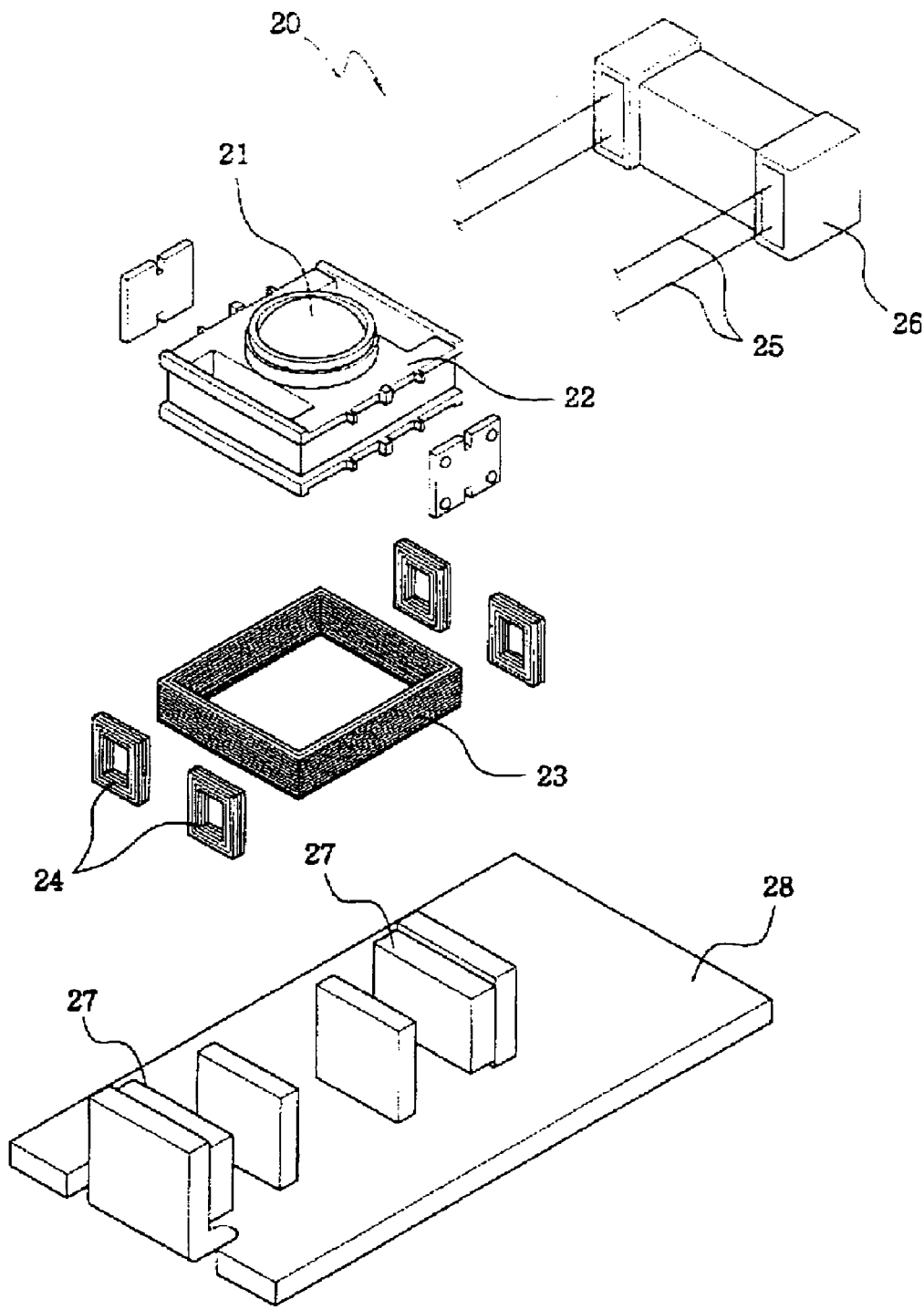
FIG. 2 is a perspective view of an actuator of the optical pickup device shown in FIG. 1.

A conventional actuator module shown in FIG. 2 uses a plurality of conventional winding coils having complicated bobbin in shape and structure. However, since the bobbin 300 is integrated with the new winding coils (circuit pattern) on the PCB 301 in a single monolithic body, the PCB 301 itself functions as a bobbin. The conventional winding coils are replaced with circuit patterns formed on the PCB 301 as shown in FIGS. 4, 5A, and 5B, thereby simplifying the structure and shape of the bobbin.

The permanent magnets 308a and 308b are a plate having both sides each having divided polarities, e.g., an N polarity and an S polarity, instead of a plate having one side with the N polarity and the other side with the S polarity, as shown in FIGS. 4, 5A, and 5B.

Figure 6:
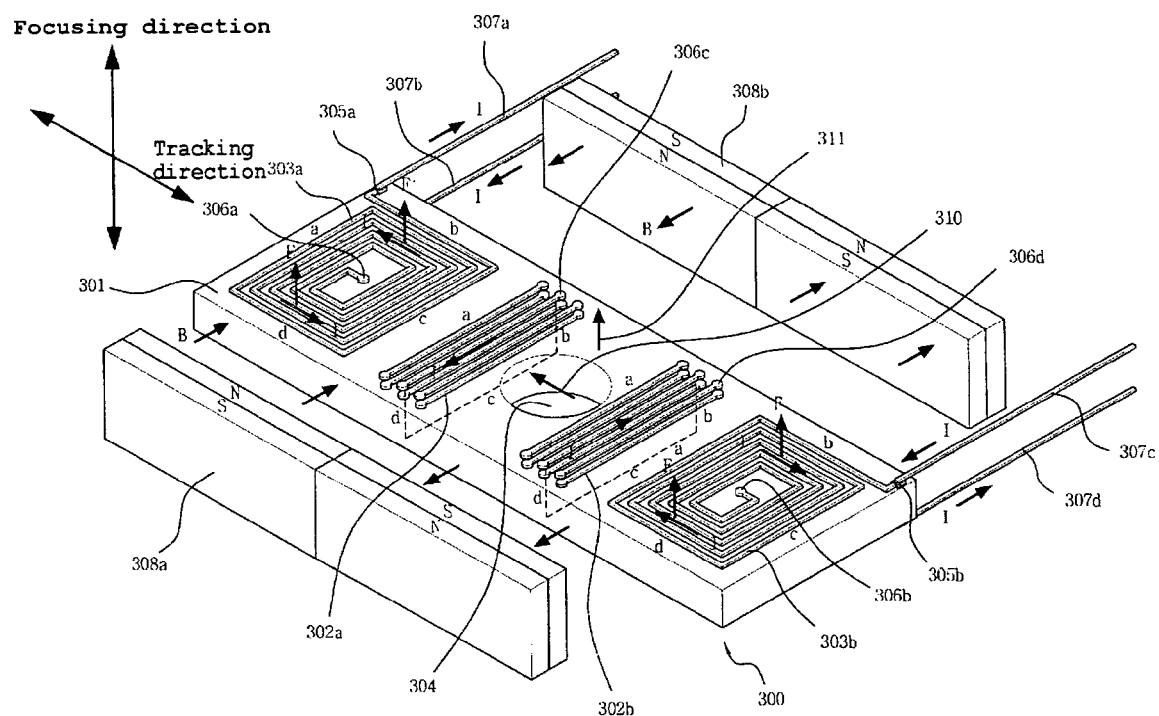
FIG. 6 is a view showing the bobbin and another permanent magnet unit having each side dividing into N and S polarities according to another embodiment of the present invention.

FIG. 6 is a view showing the bobbin 300 and another permanent magnets 308a and 308b having each side dividing into the N and S polarities according to another embodiment of the present invention.

As shown in FIG. 6, when the permanent magnets 308a and 308b are used in the actuator, the current direction flowing through the wire, e.g., the current direction of the second tracking and focus circuit patterns 302b and 303b which are affected by the magnet field generating from the permanent magnet having the S polarity, should be opposite to the current direction shown in FIGS. 4, 5A, and 5B. If the magnet field shown in FIG. 6 is changed to be reversed, the current direction needs to be reversed.

Figure 7:
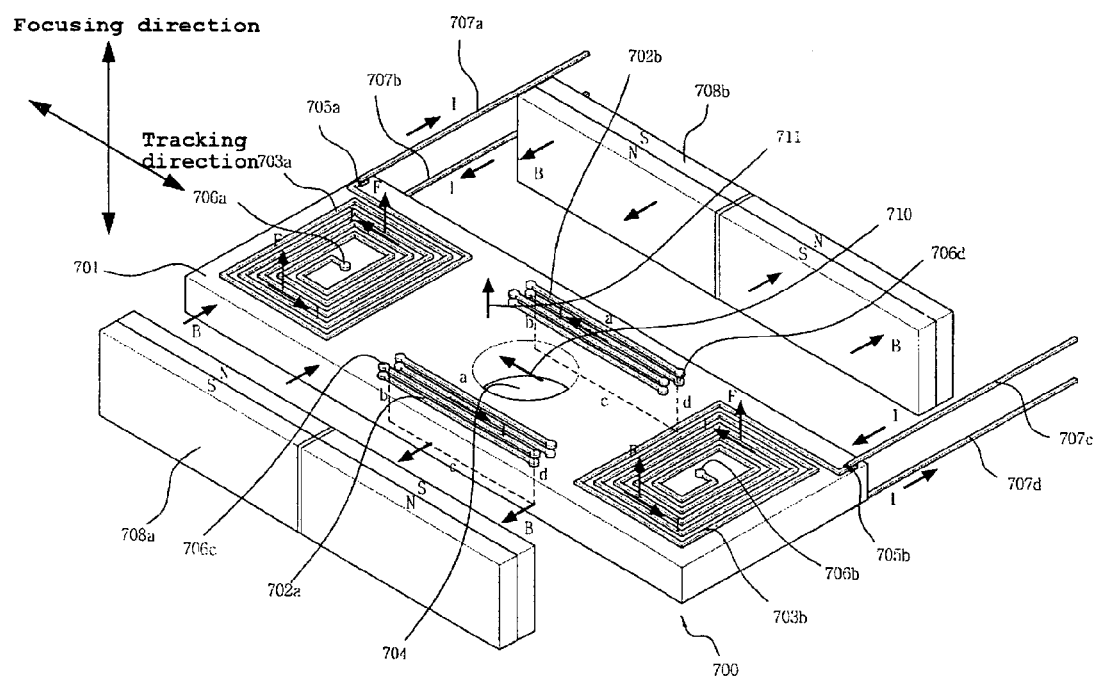
FIG. 7 is a perspective view showing the bobbin having a tracking pattern disposed to be parallel to the permanent magnet unit according to another embodiment of the present invention.

FIG. 7 is a view showing an operation and a structure of a bobbin 700 having first and second tacking circuit patterns 702a and 702b disposed parallel to permanent magnets 708a and 708b. Current flows through wires 707a, 707b, 707c, and 707d in directions shown in FIG. 7, and directions of a magnetic field, the current, and the Lorentz force exerted on the bobbin according to the directions of the magnetic field and the current are shown in FIG. 7. F, B, and I represent the Lorentz force, the magnetic field, and the current, respectively.

The first and second tracking circuit patterns 702a and 702b are disposed on both opposite sides of an objective lens hole 704 through which an objective lens is mounted on the bobbin 700. Also, the first and second focusing circuit patterns 703a and 703b are disposed on other opposite sides of the objective lens hole 704 through which the objective lens is mounted on the bobbin 700.

The first and second tracking circuit patterns 702a and 702b is indicated by a broken line and is formed in a rectangular shape having a, b, c, and d portions. FIG. 7 shows the a portion disposed on the front (upper) side of a PCB 701. As long as the current flows through the first and second tracking circuit patterns 702a and 702b in a desired direction, the power (current) supplied to the first and second tracking circuit patterns 702a and 702b can be supplied from the same power (current) source as first and second focusing circuit patterns 703a and 703b or from a separate power (current) source. That is, the first and second tracking circuit patterns 702a and 702b can be connected to the same power (current) source as first and second focusing circuit patterns 703a and 703b or to the separate power (current) source.

The same patterns as the first and second tracking circuit patterns 702a and 702b and the first and second focusing circuit patterns 703a and 703b are formed on a rear side of the PCB 701 symmetrically with respect to the PCB of a bobbin 700.

As shown in FIG. 7, via holes 706a and 706b are formed on center portions of the first and second focusing circuit patterns 703a and 703b, respectively, to electrically connect the first and second focusing circuit patterns 703a and 703b disposed on the upper side of the PCB 701 to the first and second focusing circuit patterns 703a and 703b (not shown) disposed on the lower side of the PCB 701. Further, connection pads 705 and 705b are formed on ends of the first and second focusing circuit patterns 703a and 703b to connect the power (current) supply. In addition, via holes 706c and 706d are formed on center portions of the first and second tracking circuit patterns 702a and 702b, respectively, to electrically connect the first and second tracking circuit patterns 702a and 702b disposed on the upper side of the PCB 701 to the first and second tracking circuit patterns 702a and 702b (not shown) disposed on the lower side of the PCB 701.

When the directions of the current flowing through the first and second tracking circuit patterns 702a and 702b is changed to be in an opposite direction with respect to the magnetic field as shown in FIG. 7, the permanent magnets 708a and 708b should be divided to have divided polarities as shown in FIG. 6 in consideration of the current direction flowing through the b and d portions generating the force in a tracking direction 710. Since the permanent magnets 708a and 708b includes the divided polarities, the Lorentz force is generated in the tracking direction 710 although the directions of the current flowing through the b and d portions, respectively, to generate the Lorentz force are opposite to each other.

When each of the permanent magnets 708a and 708b is divided to have the divided polarities, the directions of the current flowing through the first and second focusing circuit patterns 703a and 703b should be opposite to each other.

The first and second tracking circuit patterns 702a and 702b receives the force to be moved in the tracking direction 710, and the first and second focusing circuit patterns 703a and 703b receives the force to be lifted in a focusing direction 711.

Instead of the permanent magnets 708a and 708b shown in FIG. 7, the permanent magnets 308a and 308b shown in FIG. 4 can be used in the bobbin 700. In this case, the directions of the current flowing through the first and second tracking circuit patterns 702a and 702b and the first and second focusing circuit patterns 703a and 703b may be reversed as opposed to the direction shown in FIG. 7.

Figure 8:
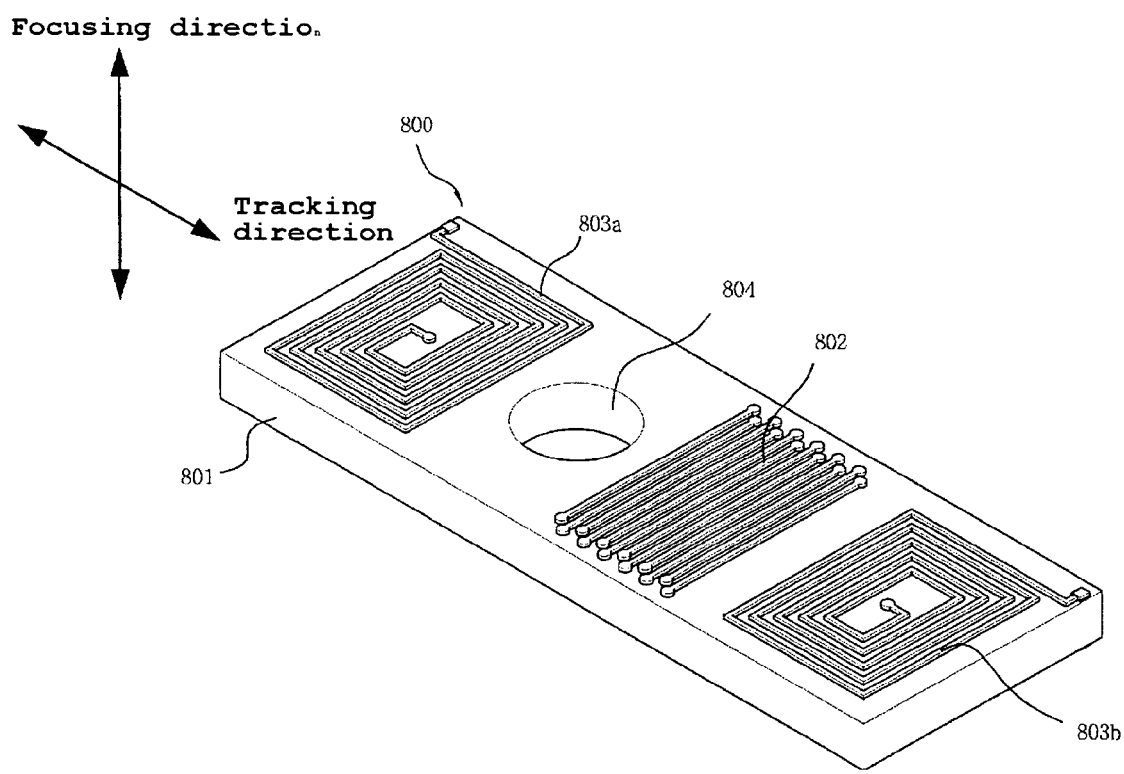
FIG. 8 is a perspective view showing another bobbin having a single tracking circuit pattern according to another embodiment of the present invention.

FIG. 8 is a view showing a bobbin 800 having a single tracking circuit pattern 802 formed in a monolithic body on a PCB 801 according to another embodiment of the present invention. The bobbin 800 is formed with first and second focusing circuit patterns 803a and 803b formed on the PCB 801. When two tracking circuit patterns are integrated into the single tracking circuit pattern 802, an objective lens mounting hole 804 may be not located on a center portion of the bobbin 800 but located on a non-center portion of the bobbin 800. In order to reduce the bobbin 800 in size, locations of the tracking circuit pattern 802 and the focusing circuit patterns 803a and 803b, and the objective lens mounting hole 804 can be arranged asymmetrically.

As described above, since the first and second tracking circuit patterns 302a and 302b shown in FIGS. 3, 4A, and 4B does not affect the titling operation, the single tracking circuit pattern 802 can be disposed adjacent to the objective lens mounting hole 804.

Figure 9:
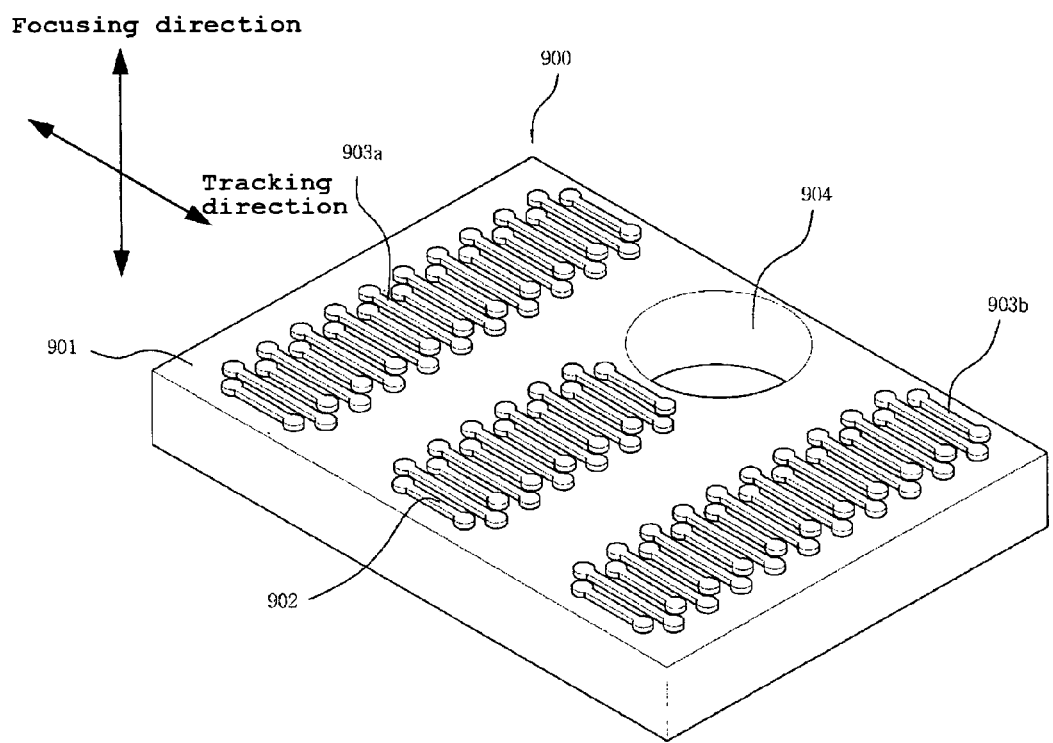
FIG. 9 is a perspective view showing another bobbin having two focusing circuit patterns and a tracking circuit pattern formed in the same direction according to another embodiment of the present invention.

FIG. 9 is a view showing a bobbin 900 having a single tracking circuit pattern 902 according to another embodiment of the present invention. Referring to FIG. 9, first and second focusing circuit patterns 903a and 903b are disposed on both sides of the bobbin 900 and the objective lens attachment portion 904, and the single tracking circuit pattern 902 is disposed on a center axis of the bobbin 900.

The first and second focusing circuit patterns 903a and 903b and the single tracking circuit pattern 902 are formed in the same solenoid type, and a solenoid axis of the solenoid type of the first and second focusing circuit patterns 903a and 903b and the single tracking circuit pattern 902 is perpendicular to a tracking direction.

Figure 10:
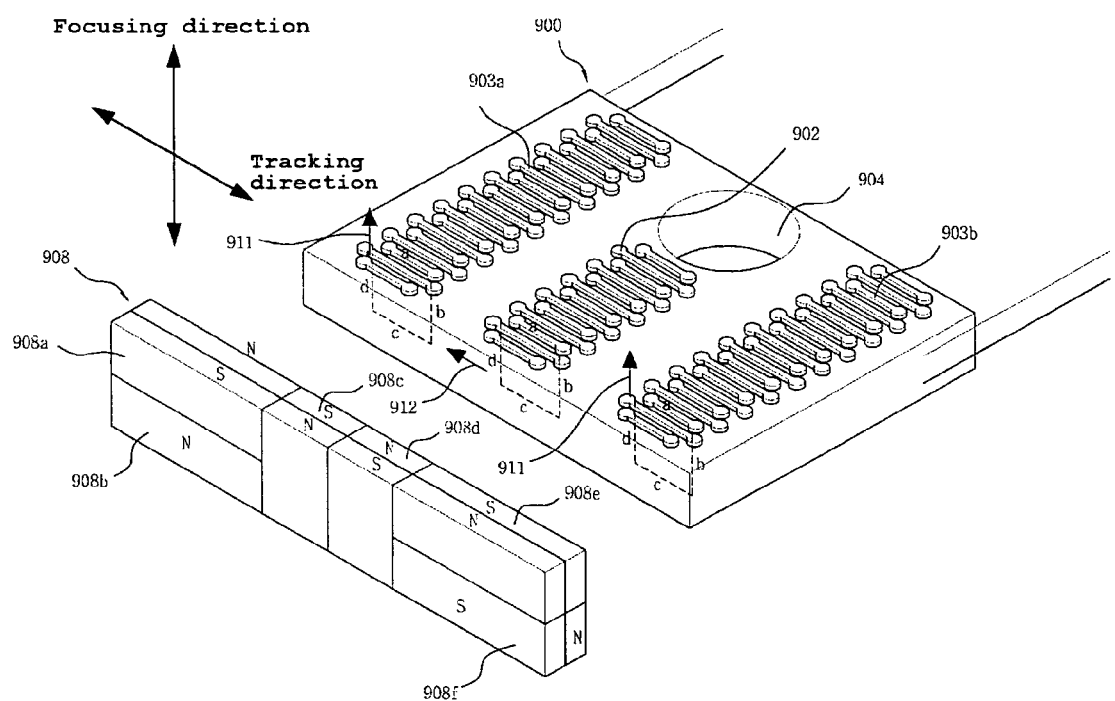
FIG. 10 is a perspective view showing a permanent magnet unit and the bobbin shorn in FIG. 9.

In the bobbin 900 having the above structure, a focusing force is exerted on the first and second focusing circuit patterns 903a and 903b in a focusing direction, and a tracking force is exerted on the single tracking circuit pattern 902 in the tracking direction when the permanent magnets each having divided polarities are arranged as shown in FIG. 10.

Figure 11A:
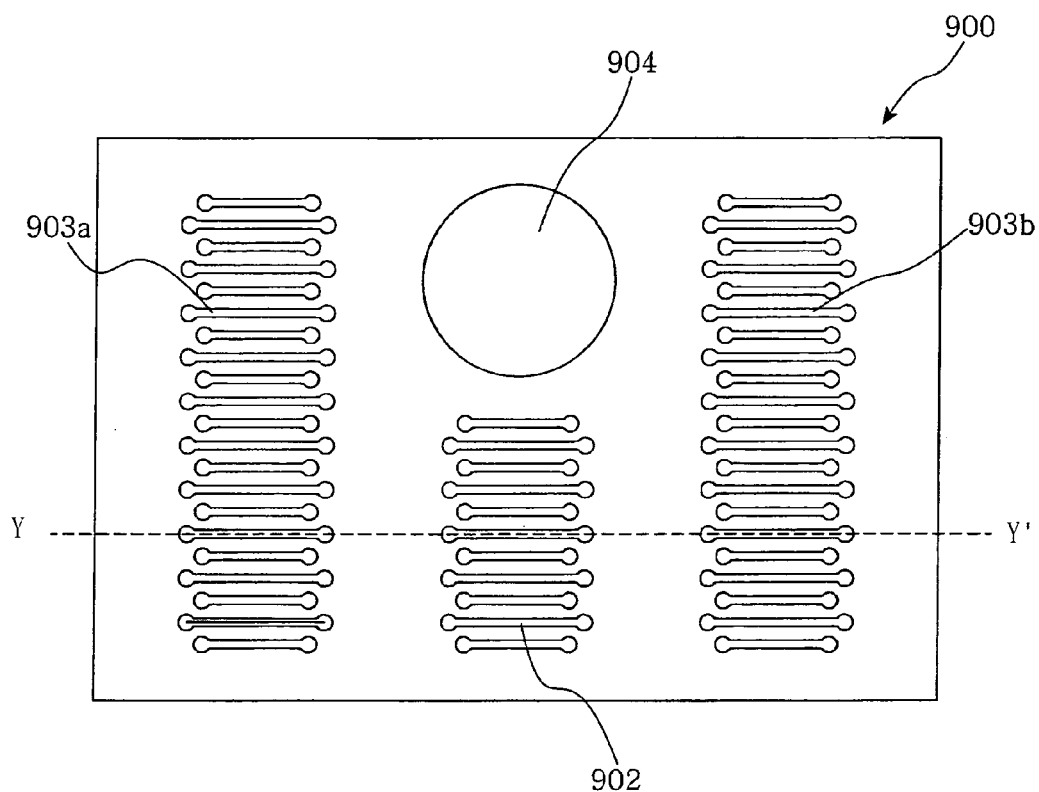
FIG. 11A is a plan view of the bobbin shown in FIG. 9.

FIG. 10 is a view showing the bobbin 900, shown in FIG. 9, and permanent magnets having divided polarities generating the magnetic fields. FIG. 11A is a plan view of the bobbin 900 of FIG. 10, and FIG. 11B is a cross-sectional view of the bobbin 900 taken along a line Y-Y' of FIG. 11A.

Figure 11B:
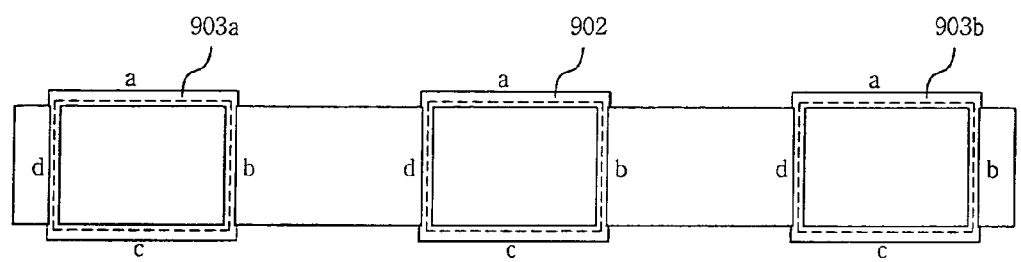
FIG. 11B is a cross-sectional view taken along a line Y-Y' of FIG. 11A.

Referring to FIGS. 10, 11A, and 11B, it is necessary to arrange the permanent magnets 908 having first, second, third, fourth, fifth, and sixth plate-type divided permanent magnets 908a, 908b, 908c, 908d, 908e, and 908f having different polarities around the bobbin 900 so as to generate the force on the a, b, c, and d portions, indicated by broken lines, of the tracking circuit pattern 902 and the first and second focusing circuit patterns 903a and 903b in the tracking and focusing directions, respectively. Six small-sized permanent magnets can be attached to each other to form the permanent magnets 908 or a single magnet can be divided into portions having the different polarities.

The a portion of the first focusing circuit pattern 903a is under influence of the first divided permanent magnet 908a of the permanent magnet 908, and the c portion of the first focusing circuit pattern 903a is under influence of the second divided permanent magnet 908b of the permanent magnet 908. Upper sides of the b and d portions of the first focusing circuit pattern 903a is under influence of the first divided permanent magnet 908a of the permanent magnet 908, and lower sides of the b and d portions of the first focusing circuit pattern 903a is under influence of the second divided permanent magnet 908b of the permanent magnet 908.

The a portion of the second focusing circuit pattern 903b is under influence of the fifth divided permanent magnet 908e of the permanent magnet 908, and the c portion of the second focusing circuit pattern 903b is under influence of the sixth divided permanent magnet 908f of the permanent magnet 908. Upper sides of the b and d portions of the second focusing circuit pattern 903b is under influence of the fifth divided permanent magnet 908e of the permanent magnet 908, and lower sides of the b and d portions of the second focusing circuit pattern 903b is under influence of the sixth divided permanent magnet 908f of the permanent magnet 908.

As shown in FIGS. 10, 11A, and 11B, when the current flows through the first and second focusing circuit patterns 903a and 903b in a clockwise direction, the a and c portions of the first and second focusing circuit patterns 908a and 908b receive a lifting force. The Lorentz forces exerted on the b and d portions of the first and second focusing circuit patterns 903a and 903b are offset. As a result, the lifting force is exerted on the first and second focusing circuit patterns 903a and 903b to lift them in the direction 911.

The b portion of the tracking circuit pattern 902 is under influence of the fourth divided permanent magnet 908d of the permanent magnet 908, and the d portion of the tracking circuit pattern 902 is under influence of the third divided permanent magnet 908c of the permanent magnet 908.

As shown in FIGS. 10, 11A, and 11B, when the current flows through the tracking circuit patterns 902 in the clockwise direction, the b and d portions of the tracking circuit pattern 902 receives a pushing force in a direction of an arrow 912, and the Lorentz forces exerted on the a and c portions of the tracking circuit pattern 902 are offset. As a result, the pushing force is exerted on the tracking circuit pattern 902 to push the tracking circuit pattern 902 in the direction 912.

FIGS. 12A through 12E are views showing a method of manufacturing the bobbin integrated with the winding coils in a single monolithic body on the PCB as shown in FIGS. 4 through 11B.

Figure 12A:
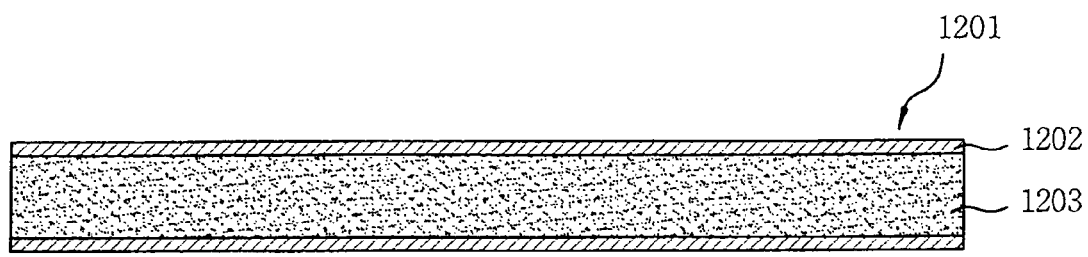
FIGS. 12A through 12E are views showing a method of manufacturing the bobbin integrally formed with the winding coil on the printed circuit board shown in FIGS. 3 through 11B.

FIG. 12A shows a cross-sectional view of a copper clad laminate (CCL) 1201 having an insulation layer 1203 and copper layers 1202 spaced-apart by a distance corresponding to a thickness of the insulation layer 1203 before a manufacturing process.

The CCL 1201 is classified into a glass/epoxy CCL, a heat-resisting resin CCL, a paper/phenol CCL, a high-frequency CCL, a flexible CCL (polyimide film), a complex CCL, and so on according to their usage. It is an aspect of the invention to use the glass/epoxy CCL which is used to manufacture a double-sided PCB or a multi-layer PCB.

Figure 12B:
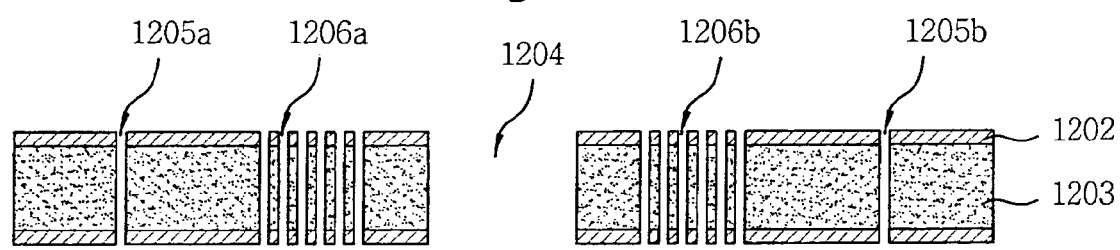

In FIG. 12B, drilling operations are performed to form first via holes 1205a and 1205b to connect the focusing circuit patterns formed on the respective ones of the upper and lower sides of the PCB 301, 701, 801, or 901, second via holes 1206a and 1206b to connect the tracking circuit pattern formed on the upper and lower sides of the PCB 301, 701, 801, or 901, and an objective mounting portion 1204.

Figure 12C:
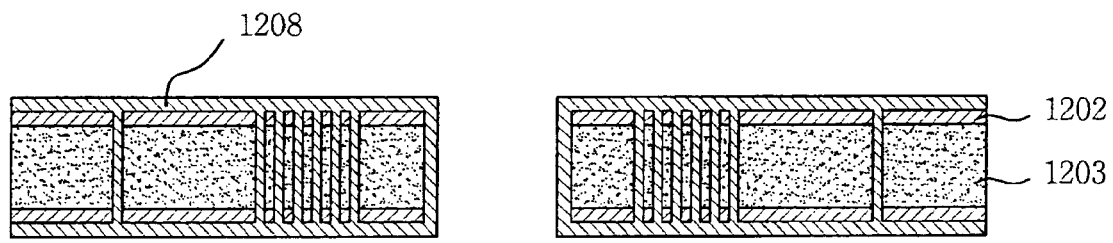

In FIG. 12C, a cupper coating layer 1208 is formed on internal surfaces of the first and second via holes 1205a, 1205b, 1206a, and 1206b using electrolytic and non-electrolytic copper coating operations. After the non-electrolytic copper coating operation is performed, the electrolytic copper coating operation is performed. An electrolytic copper coating layer and a non-electrolytic copper coating layer are shown in FIG. 12C as a layer, e.g., the cupper coating layer 1208. The non-electrolytic copper coating operation is performed before the electrolytic copper coating operation since the electrolytic copper coating-operation, which requires a coating surface to be electrically conductive, cannot be performed on a non-conductive layer, such as the internal surface of the via holes 1205a, 1205b, 1206a, and 1206b. The non-electrolytic copper coating operation is performed as a pre-process of the electrolytic copper coating operation so as to form the electrically conductive layer required to perform the electrolytic copper coating operation.

Each inside space of the via holes 1205a, 1205b, 1206a, and 1206b is filled up with a filler. Although the filling of the via holes 1205a, 1205b, 1206a, and 1206b can be performed using a separate process, it is an aspect of the present invention to fill up the via holes 1205a, 1205b, 1206a, and 1206b through the non-electrolytic copper coating operation and the electrolytic copper coating operation without performing the separate process since the via holes 1205a, 1205b, 1206a, and 1206 are small in diameter.

Figure 12D:
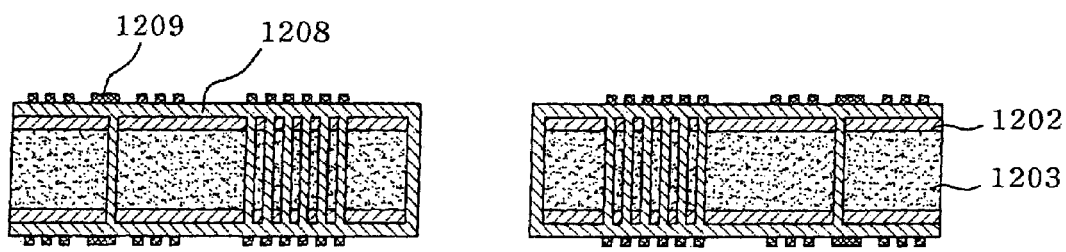

FIG. 12D shows a process of forming an etching resist pattern 1209 to form the tracking and focusing circuit patterns. A circuit pattern printed on an art-work film is transcribed to form the resist pattern 1209. There are various processes of transcribing the circuit pattern to form the resist pattern. One of the transcribing processes is a method of transcribing a circuit pattern, printed on an art-work film using ultraviolet, on a dry film having photo sensitivity using ultraviolet. It is possible to use a liquid photo resist (LPR) as the resist pattern 1209 instead of the dry film.

Figure 12E:
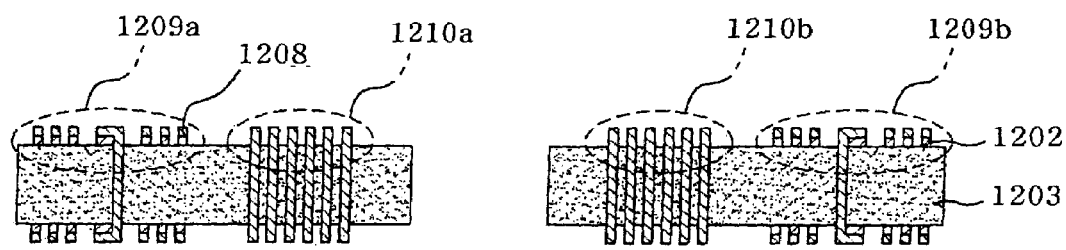

In FIG. 12E, focusing circuit patterns 1209a and 1209b and tracking circuit patterns 1210a and 1210b are formed when the a product of FIG. 12D is in an etching liquid.

FIGS. 12A through 12E show the cross-sectional views showing methods of forming the PCB 301 shown in FIGS. 4, 5A and 5B. When any circuit pattern is changed in shape or structure to form the PCB 701, 801, or 901, the processes of FIGS. 12A through 12E can be used to form the PCB 701, 801, or 901 or other type than the PCB 301, 701, 801, or 901.

As described above, since the bobbin integrally is formed with the winding coils in a monolithic single body according to embodiments of the present invention, the number of the part and a weight of the bobbin are reduced. Since the bobbin is lighter than a conventional bobbin, the moving sensitivity of the bobbin in the tracking and focusing directions are more excellent than the conventional winding coil and the bobbin. Moreover, since the number of the parts of the bobbin is decreased, manufacturing costs can be lowered.

While the conventional bobbin requires various processes of providing a bobbin it self, providing a cast to form the bobbin, providing the winding coil, winding the winding coil on the bobbin, mounting the objective lens, and soldering-wires and parts to manufacture the bobbin attached with the winding coil, the bobbin having the winding coil according to embodiments of the present invention needs only a process of forming the bobbin with the winding coil, mounting the objective lens, and attaching the wire to form the actuator, thereby reducing the manufacturing processes and costs.

According to another aspect of the present invention, the focusing circuit pattern is a spiral type, the tracking circuit pattern is a solenoid type, and the permanent magnet not having the divided polarities can be used to generate the magnet field to the focus and tracking circuit patterns.

It is impossible to reduce a thickness of the conventional bobbin due to the thickness of the winding coil. However, it is possible that the thickness of the bobbin with the tracking and focus circuit patterns according to the present invention can be reduced since the PCB is used in a horizontal direction parallel to the tracking direction. Accordingly, the bobbin with the tracking and focus circuit patterns according to the present invention can meet user demands on minimizing the electronic product in size and the actuator in thickness.

In the bobbin with the tracking and focus circuit patterns according to the present invention, it is possible that disconnection of a copper wire of the winding coil is reduced since the tracking and focus circuit patterns are integrally formed with the bobbin.

Any defect on the bobbin integrally formed with the winding coil (circuit pattern) can be detected using examining a short circuit in a state where circuits have been formed on the PCB before a final appearance finishing process.

It is impossible to reduce the thickness of the conventional bobbin attached with the winding coil due to the thickness of the winding wire of about 5.0 mm. However, since the bobbin integrally formed with the winding coil (circuit pattern) requires only a small space having a thickness of the 0.4-0.6 mm for the arrangement of the divided permanent magnets, thereby meeting the user demands on the thinner actuator and the minimized electronic product.

Although a few preferred embodiments of the present invention have been shown and described, it would be appreciated by those skilled in the art that changes may be made in this embodiment without departing from the principle and sprit of the invention, the scope of which is defined in the claims and their equivalent.

What is claimed is:

1. A bobbin used with an optical pickup actuator, comprising:
   a printed circuit board (PCB);
   a plurality of tracking circuit patterns formed on both surfaces of the PCB;
   a plurality of focusing circuit patterns formed on the both surfaces of the PCB;
   a plurality of via holes formed on the PCB, and having a conductive material line to electrically connect the tracking circuit patterns and the focusing circuit patterns;
   an objective lens mounting unit formed monolithically with the PCB; and
   a connecting pad through which a power is supplied to the tracking and focusing circuit patterns.

2. The bobbin of claim 1, wherein the tracking circuit patterns are a solenoid type shape winding around an axis parallel to a tacking direction.

3. The bobbin of claim 2, wherein the tracking circuit patterns are disposed on both sides of the objective lens mounting unit.

4. The bobbin of claim 2, wherein the tracking circuit patterns are disposed on one side of the objective lens mounting unit.

5. The bobbin of claim 1, wherein the tracking circuit patterns are a solenoid type shape winding around an axis perpendicular to a tracking direction.

6. The bobbin of claim 5, wherein the tracking circuit patterns are disposed on both sides of the objective lens mounting unit.

7. The bobbin of claim 5, wherein the tracking circuit patterns are disposed on one side of the objective lens mounting unit.

8. The bobbin of claim 1, wherein the focusing circuit patterns are a spiral type shape winding around an axis parallel to a focusing direction.

9. The bobbin of claim 1, wherein the focusing circuit patterns are a solenoid type shape winding around an axis perpendicular to a tracking direction.

10. The bobbin of claim 1, wherein the focusing circuit patterns are disposed on both outsides of respectively ones of the tracking circuit patterns.

11. The bobbin of claim 1, wherein a material of the PCB comprises one of FR4, BT resin and polyimide.

12. The bobbin of claim 1, wherein the objective lens mounting unit is formed on a center portion of the PCB.

13. The bobbin of claim 1, wherein the connecting pad comprises four sub-connecting pads through which the power is supplied to the tracking and focusing circuit patterns.

14. A disc player having an optical pickup actuator, comprising:
    a bobbin made of a printed circuit board (PCB), and movably mounted on the actuator;
    a plurality of tracking circuit patterns integrally formed on both surfaces of the PCB;
    a plurality of focusing circuit patterns integrally formed on the both surfaces of the PCB;
    a plurality of via holes formed on the PCB, and having a conductive material line to connect corresponding ones of the tracking circuit patterns and the focusing circuit patterns;
    an objective lens mounting unit formed monolithically with the PCB; and
    a connecting pad through which a power is supplied to the tracking and focusing circuit patterns.

15. A bobbin used with an optical pickup actuator of a disc player having a holder and a power source, comprising:
    a printed circuit board (PCB) having major surfaces;
    a pair of tracking circuit patterns formed on corresponding ones of the major surfaces of the PCB;
    a first conductive material line disposed along the thickness of the PCB to electrically connect the tracking circuit patterns;
    a pair of focusing circuit patterns formed on corresponding ones of the major surfaces of the PCB:
    a lens attachment portion formed monolithically with the PCB; and
    a second conductive material line disposed along the thickness of the PCB to electrically connect the focusing circuit patterns.

16. The bobbin of claim 15, further comprising:
    a wire unit elastically supporting the PCB with respect to the holder, and electrically connecting the power source to the tracking circuit patterns and the focusing circuit patterns through the first and second conductive material lines.

17. The bobbin of claim 15, wherein the first conductive material line is disposed on an area corresponding to the tracking circuit patterns.

18. The bobbin of claim 15, wherein the first and second conductive material lines are disposed parallel to each other.

19. The bobbin of claim 15, wherein the first and second conductive material lines have the same length as a thickness of the PCB.

20. The bobbin of claim 15, wherein the major surfaces of the PCB are spaced-apart from each other by a distance, and the first and second conductive material lines have the same length as the distance.

21. The bobbin of claim 15, wherein the PCB comprises first and second via holes formed on the PCB, and the first and second conductive material lines are disposed in the first and second via holes, respectively.

22. The bobbin of claim 15, further comprising:
   a pair of second focusing circuit patterns formed on corresponding ones of the major surfaces of the PCB; and
   a third conductive material line disposed along the thickness of the PCB to electrically connect the second focusing circuit patterns.

23. A bobbin used with an optical pickup actuator of a disc player having a holder and a power source, comprising:
   a printed circuit board (PCB) having major surfaces and first and second via holes formed along the thickness of the PCB;
   a pair of tracking circuit patterns formed on corresponding ones of the major surfaces of the PCB;
   a first conductive material line disposed in the first via hole to electrically connect the tracking circuit patterns;
   a pair of focusing circuit patterns formed on corresponding ones of the major surfaces of the PCB;
   a lens attachment portion formed monolithically with the PCB; and
   a second conductive material line disposed in the second via hole to electrically connect the focusing circuit patterns.

24. A bobbin used with an optical pickup actuator of a disc player having a holder and a power source, comprising:
   a printed circuit board (PCB) having major surfaces and a via hole formed along the thickness of the PCB;
   a pair of tracking circuit patterns formed on corresponding ones of the major surfaces of the PCB;
   a conductive material line disposed in the via hole to electrically connect the tracking circuit patterns; and
   a lens attachment portion formed monolithically with the PCB.

25. A bobbin used with an optical pickup actuator of a disc player having a holder and a power source, comprising:
   a printed circuit board (PCB) having major surfaces and elastically supportable on the holder;
   a pair of tracking circuit patterns formed on corresponding ones of the major surfaces of the PCB in a direction and electrically connectable to the power source;
   a conductive material line disposed along the thickness of the PCB to electrically connect the tracking circuit patterns; and
   a lens attachment portion formed monolithically with the PCB.

26. The bobbin of claim 25, wherein the tracking circuit patterns and the conductive material line form a plane perpendicular to the first direction and the major surfaces.

27. The bobbin of claim 25, further comprising:
   a focusing circuit pattern formed on at least one of the major surfaces of the PCB, disposed parallel to the at least one of the major surfaces, connectable to the power source, and having at least one sub-pattern disposed perpendicular to the conductive material line and the first direction.

* * * * *